United States Patent
Coronel et al.

(10) Patent No.: US 7,202,153 B2
(45) Date of Patent: Apr. 10, 2007

(54) METHOD FOR FORMING, UNDER A THIN LAYER OF A FIRST MATERIAL, PORTIONS OF ANOTHER MATERIAL AND/OR EMPTY AREAS

(75) Inventors: Philippe Coronel, Barraux (FR); Yves Laplanche, Crolles (FR); Laurent Pain, Saint Nicolas de Macherin (FR)

(73) Assignees: STMicroelectronics S.A., Montrouge (FR); Commissariat a l'Ernergie, Atomique, Paris Cedex (FR)

( * ) Notice: Subject to any disclaimer, the term of this patent is extended or adjusted under 35 U.S.C. 154(b) by 0 days.

(21) Appl. No.: 10/914,578

(22) Filed: Aug. 9, 2004

(65) Prior Publication Data

US 2005/0037603 A1    Feb. 17, 2005

(30) Foreign Application Priority Data

Aug. 12, 2003   (FR) .................................. 03 50425

(51) Int. Cl.
*H01L 21/4163*    (2006.01)
(52) U.S. Cl. ................... 438/619; 438/622; 438/798
(58) Field of Classification Search ............. 438/619, 438/618, 622, 623, 798
See application file for complete search history.

(56) References Cited

U.S. PATENT DOCUMENTS

| | | | |
|---|---|---|---|
| 4,557,995 A | | 12/1985 | Broers et al. |
| 4,595,649 A | | 6/1986 | Ferguson et al. |
| 6,071,805 A | * | 6/2000 | Liu .............. 438/619 |
| 6,287,979 B1 | * | 9/2001 | Zhou et al. ............ 438/723 |
| 6,455,227 B1 | * | 9/2002 | Hara .............. 430/273.1 |
| 6,495,403 B1 | * | 12/2002 | Skotnicki et al. ............ 438/157 |
| 6,531,403 B2 | * | 3/2003 | Ezaki .............. 438/710 |
| 6,696,315 B2 | * | 2/2004 | Leuschner et al. ............ 438/99 |
| 6,716,741 B2 | * | 4/2004 | Chang et al. ............ 438/623 |
| 6,790,761 B2 | * | 9/2004 | Sakata .............. 438/619 |
| 6,790,788 B2 | * | 9/2004 | Li et al. ............ 438/778 |
| 6,831,005 B1 | * | 12/2004 | Ross ............ 438/633 |
| 6,867,125 B2 | * | 3/2005 | Kloster et al. ............ 438/618 |
| 6,903,461 B2 | * | 6/2005 | Kloster et al. ............ 257/759 |
| 2002/0187627 A1 | * | 12/2002 | Yuang ............ 438/622 |
| 2003/0020180 A1 | * | 1/2003 | Ahn et al. ............ 257/786 |
| 2004/0102031 A1 | * | 5/2004 | Kloster et al. ............ 438/619 |

FOREIGN PATENT DOCUMENTS

FR    2 693 030 A    12/1993

OTHER PUBLICATIONS

French Search Report from French Patent Application 03/50425, filed Aug. 12, 2003.
Persson M., Pettersson J: "Submicron air-bridge interconnection process for complex gate geometries" J. Vac. Sci. Technol. B, Microelectron. Nanometer Struct., vol. 15, No. 5, Sep. 1997, pp. 1724-1727, XP002283979.
Chiu G. T. et al: "Electron Discharging For Electronbeam Exposure" IBM Technical Disclosure Bulletin, IBM Corp. New York, US, vol. 27, No. 8, Jan. 1985, p. 5014 XP000807789 ISSN: 0018-8689.

\* cited by examiner

*Primary Examiner*—Andy Huynh
*Assistant Examiner*—David Goodwin
(74) *Attorney, Agent, or Firm*—Lisa K. Jorgenson; James H. Morris; Wolf, Greenfield & Sacks, P.C.

(57) ABSTRACT

A method for forming a empty area under a layer of a given material, including forming on a substrate a stacking of a photosensitive layer and of a layer of the given material; insolating a portion of the photosensitive layer or its complement according to whether the photosensitive layer is positive or negative with an electron beam crossing the layer of the given material; and removing the portion of the photosensitive layer.

2 Claims, 5 Drawing Sheets

METHOD FOR FORMING, UNDER A THIN LAYER OF A FIRST MATERIAL, PORTIONS OF ANOTHER MATERIAL AND/OR EMPTY AREAS

BACKGROUND OF THE INVENTION

1. Field of the Invention

The present invention relates to integrated circuit manufacturing methods.

The method of the present invention more specifically aims at forming, under a layer of a first material, empty areas and/or portions of another material.

2. Discussion of the Related Art

Known ion implantation techniques enable forming buried layers in a substrate by having implanted ions react with the substrate. An example of an ion implantation is the implantation of oxygen $O_2$ in a silicon substrate to form buried silicon oxide layers $SiO_2$.

This implantation technique is however relatively destructive for the upper part of the substrate. Further, it does not enable forming a buried layer of any type of material. Further, the thickness of the buried layer is difficult to control.

Another known buried layer forming technique is that implemented for example upon forming of devices of SON (silicon on nothing) type. After the epitaxial growth of a silicon/germanium layer followed by a silicon layer, one or several portions of the silicon layer are etched to be able to remove, by etching, the underlying silicon/germanium layer. A dielectric or conductive layer is then deposited under the silicon layer by filling the space previously taken up by the silicon/germanium layer.

Once the layer has been deposited, no known technique enables removing chosen portions of the dielectric or conductive layer. A disadvantage of this technique thus is that the deposited layer necessarily has a shape identical to that of the silicon/germanium layer.

SUMMARY OF THE INVENTION

An object of the present invention is to provide such a method for forming, under a layer of a given material, portions of another material and/or empty areas having any shape.

Another object of the present invention is to provide such a method which is non-destructive for the layer of a given material.

Another object of the present invention is to provide such a method that enables forming portions of any other material.

To achieve these and other objects, the present invention provides a method for forming an empty area under a layer of a given non photosensitive material comprising; forming on a substrate a stacking of a photosensitive layer and of a layer of the given material; insolating a portion of the photosensitive layer or its complement according to whether the photosensitive layer is positive or negative with an electron beam crossing the layer of the given material; and removing said portion of the photosensitive layer.

According to an embodiment of the above-mentioned method, at least one opening of said layer of the given material emerging into said portion is formed prior to the removal of said portion of the photosensitive layer.

According to an embodiment of the above-mentioned method, the method further comprises filling with a second material the space previously taken up by the removed portion of the photosensitive layer.

According to an embodiment of the above-mentioned method, the method further comprises removal of the remaining portions of the photosensitive layer.

According to an embodiment of the above-mentioned method, the method comprises, prior to the removal of said remaining portions of the photosensitive layer, forming of at least one opening of said layer of the given material emerging into one of said remaining portions and further comprising filling with a third material different from the second material the space previously taken up by the remaining portions of the photosensitive layer.

According to an embodiment of the above-mentioned method, the removal of said portion of the photosensitive layer is performed by means of a plasma, said portion volatilizing after transformation in crossing said layer of the given material.

According to an embodiment of the above-mentioned method, the removal of the remaining portions of the photosensitive layers is performed by means of an oxygen plasma, the remaining portions volatilizing after transformation in crossing said layer of the given material.

According to an embodiment of the above-mentioned method, the method further comprises, at forming a stacking of a photosensitive layer and of a layer of the given material, the forming of a second photosensitive layer on the stacking, and the insolation step is performed to insolate the two photosensitive layers simultaneously, whereby the insolated portions of the two layers are superposed.

The present invention also provides a method for forming an interconnect network comprising: covering a substrate with a stacking of a first insulating layer, of a first photosensitive layer, and of a second insulating layer; forming openings in the stacking; filling the openings with a conductive material to form contacts; covering the second insulating layer and the contacts with a second photosensitive layer; insolating several pairs of portions of the photosensitive layer or their complements according to whether the photosensitive layer is positive or negative, the portions of a same pair being superposed and placed above and under the second insulating layer; removing the pairs of portions of the photosensitive layer; filling with a conductive material the space previously taken up by the portions of each of the pairs located above the second insulating layer.

The present invention also provides a method for forming a gate-all-around transistor comprising: forming a single-crystal silicon bridge running above an active area of a semiconductor substrate, the bridge being laid on an insulation area surrounding the active area; forming a thin silicon oxide layer around the bridge and on the active area; covering the structure and the empty space located between the active area and the bridge with a photosensitive layer; insolating two first portions of the photosensitive layer, or their complements according to whether the photosensitive layer is positive or negative, the first two portions of the photosensitive layer being superposed and placed above and under the central portion of the bridge; removing the two first and second portions of the photosensitive layer; filling with a conductive material the space previously taken up by the two first and second portions to form a gate; removing the remaining portions of the photosensitive layer; covering the structure and the empty spaces located under the bridge on either side of the gate with a silicon nitride; and performing an anisotropic etch of the nitride to form spacers on the sides of the gate portion located above the bridge.

The foregoing objects, features, and advantages of the present invention will be discussed in detail in the following non-limiting description of specific embodiments in connection with the accompanying drawings.

DETAILED DESCRIPTION

Figure 1A:
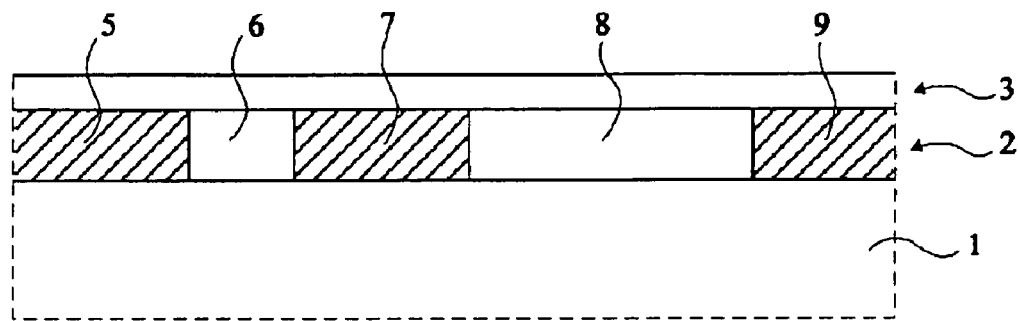
FIGS. 1A to 1D are cross-section views of structures obtained after successive steps of the method of the present invention.

For clarity, the same elements have been designated with the same reference numerals in the different drawings and, further, as usual in the representation of integrated circuits, the drawings are not to scale.

The general aspects of the method of the present invention are described in relation with FIGS. 1A to 1D. Examples of implementation of the method are described hereafter for the forming of a transistor of SON type and for the forming of an interconnect network enabling connecting the components of a circuit to one another.

In an initial step, illustrated in FIG. 1A, a stacking of a photosensitive layer 2 and of a thin layer 3 of a given material is formed on a substrate 1. Substrate 1 may have any structure obtained after a step of a standard integrated circuit forming method. The stacking of photosensitive layer 2 and of thin layer 3 may be obtained according to various methods as will appear in the examples of implementation of the method of the present invention described hereafter. Thin layer 3 may be formed of a dielectric, semiconductor, or conductor material.

According to the present invention, an insolation of one or several portions of photosensitive layer 2 with an electron beam crossing thin layer 3 is performed. The penetration depth of the electron beam through thin layer 3, photosensitive layer 2 and possibly substrate 1 depends on the electron acceleration power, on the respective thickness of the layers, and on their nature. It will be within the abilities of those skilled in the art to define the thicknesses of layers 2 and 3 as well as the acceleration power of the electron beam enabling insolation of photosensitive layer 2 while ensuring that the electron beam remains coherent in crossing thin layer 3 to have a good definition of the insolated portions. As an example, with a thin silicon layer 3 of a 100-nm thickness and a 50-keV acceleration power, the insolated portions of the photosensitive layer can be defined with an accuracy under 10 nm.

In FIG. 1A, five portions 5, 6, 7, 8, and 9 have been shown from left to right. In the case where the photosensitive layer is positive, portions 6 and 8 are insolated. In the case where the photosensitive layer is negative, portions 5, 7, and 9 are insolated.

After insolation, the insolated (or non-insolated, according to cases) portions, here portions 6 and 8, are removed. Various methods may be implemented.

In the case where the chosen type of photosensitive layer enables it, portions 6 and 8 may be removed by an "evaporation" method. This method comprises placing the structure in a plasma which modifies the structure of portions 6 and 8 without modifying that of portions 5, 7 and 9. The used plasma may be an oxygen ($O_2$), hydrogen ($H_2$), or nitrogen ($N_2$) plasma. After modification of the structure of the portions of photosensitive layer 6 and 8, the photosensitive layer is removed by passing through thin layer 3.

Figure 1B:
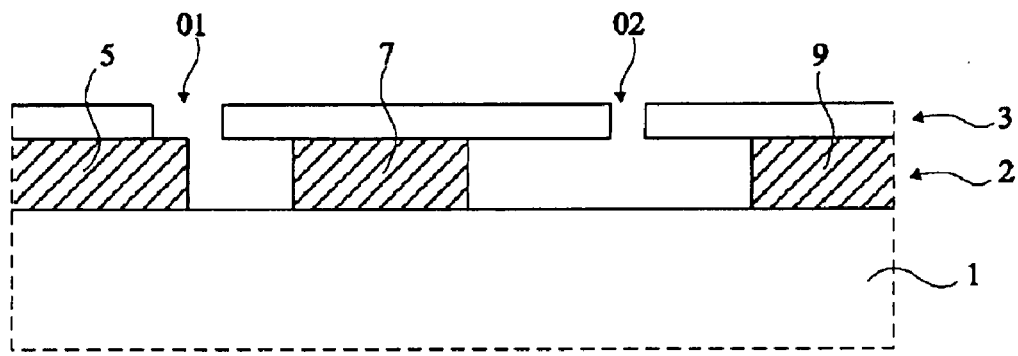

Another method for removing portions of photosensitive layer 6 and 8 is illustrated in FIG. 1B. Openings O1 and O2 are formed in thin layer 3 above portions 6 and 8. In this example, opening O1 is formed above the left-hand part of portion 6 and extends above the right-hand part of portion 5. Opening O2 is formed above the central part of portion 8. Portions 6 and 8 of the photosensitive layer are then removed by selective development. In the example shown in FIG. 1B, openings of thin layer 3 have been shown above each of the portions of photosensitive layer 2 which are desired to be removed. However, in certain structures such as that described hereafter in relation with FIGS. 3A to 3F, it is possible for the portions of the photosensitive layer which are desired to be suppressed to be accessible "sideways". In this case, it is not indispensable to form openings prior to the removal of certain portions of the photosensitive layer.

Figure 1C:
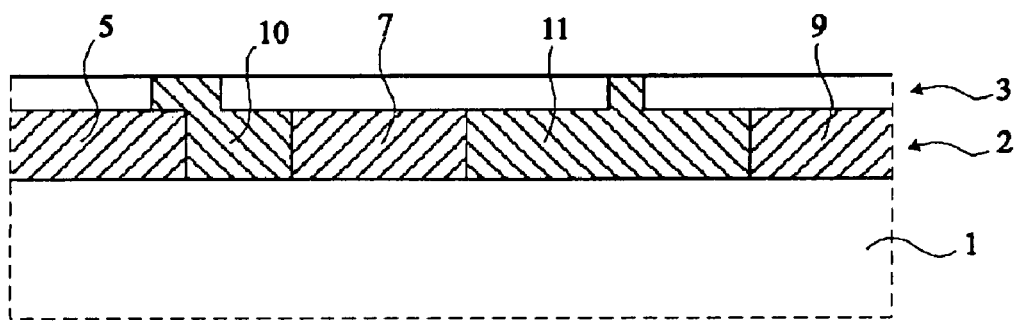

In the case where openings O1 and O2 have been formed, an additional step, illustrated in FIG. 1C, comprising filling the space previously taken up by portions 6 and 8 with a second material different from that of thin layer 3, may be provided Portions 10 and 11 of the second material have thus been formed under thin layer 3.

Figure 1D:
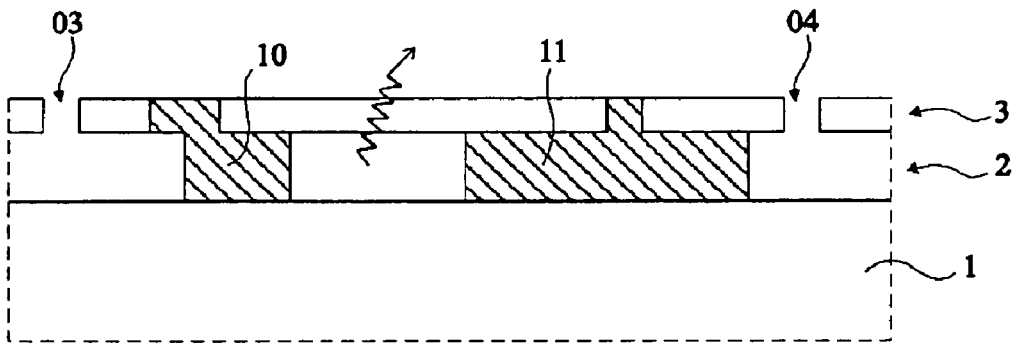

In the case where the recesses under thin layer 3 have been formed by selective chemical development and where these recesses have been filled with a second material, an additional step, illustrated in FIG. 1D, comprising removing the remaining portions of photosensitive layer 6, 7, and 9, may be provided. To remove the remaining portions of the photosensitive layer, openings, in this example O3 and O4, may be formed as previously in thin layer 3 above the portions to be removed, portions 5 and 9 in this example. In the case where the chosen type of photosensitive layer allows it, it may also be provided to place the structure in a plasma ($O_2$, $H_2$, $N_2$) likely to modify the structure of portions 5, 7 and 9 of the photosensitive layer so that the photosensitive layer is removed by passing through thin layer 3. In this example, portion 7 is removed across thin layer 3.

In the case where openings O3 and O4 have been formed, an additional step, comprising filling the space previously taken up by portions 5, 7, and 9 with a third material different from the second material, may be provided.

An advantage of the method of the present invention is that it enables forming, under a layer of a given material empty areas and/or portions of another material having any desired shape. Further, since the insolation by an electron beam is a very accurate technique, the shapes of the portions can be defined with great accuracy.

Another advantage of the method of the present invention is that it does not damage the definitive portions or layers of the formed structures.

A specific embodiment of the method of the present invention is described hereafter in an example of the forming of a gate all around (GAA) transistor.

Figure 2:
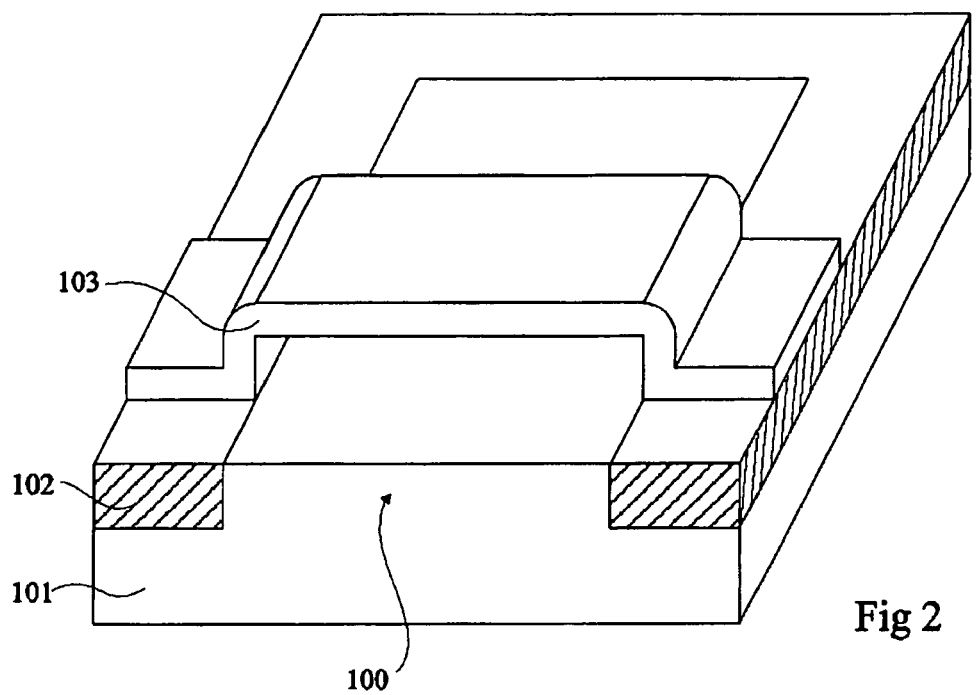
FIG. 2 is a perspective view of an intermediary structure obtained in a conventional method for forming SON-type devices.

FIG. 2 is a perspective view of an intermediary structure obtained after a step of a conventional gate-all-around transistor forming method. An active area 100 of a semiconductor substrate 101 is defined by an insulating region 102 formed at the surface of substrate 101. Active area 100 has in this example a substantially rectangular shape in top view. A silicon layer forms a bridge 103 running over active area 100 and bearing against insulating region 102 on either side of active area 100. The portion of bridge 103 located above active area 100 is a single crystal region, the portion located above insulating region 102 is polycrystalline. Active area 100 and bridge 103 are separated by a empty area Active area 100 is visible in top view on each side of bridge 103.

The structure shown in FIG. 2 is conventionally obtained by epitaxial growth of a silicon/germanium layer above active area 100 and epitaxial growth of a single-crystal silicon layer above the silicon germanium layer. The bilayer is then etched to form a strip transverse to active area 100. The remaining portion of the silicon/germanium layer is removed by etching and silicon bridge 103 is thus obtained.

FIGS. 3A to 3F are cross-section views of the structures obtained after successive steps of an example of implementation of the method of the present invention performed based on the structure shown in FIG. 2. The cross-section views are shown along a plane longitudinally cutting bridge 103.

Figure 3A:
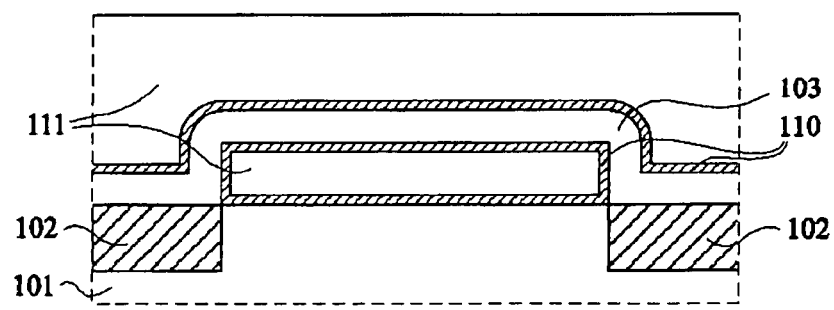
FIGS. 3A to 3F are cross-section views of structures obtained after successive steps of an example of implementation of the method of the present invention.

In a first step, illustrated in FIG. 3A, a thin silicon oxide layer $SiO_2$ is grown by thermal oxidation all around silicon bridge 103 and on active area 100. A photosensitive layer 111 is then deposited above the structure and in the empty space located between bridge 103 and active area 100.

Figure 3B:
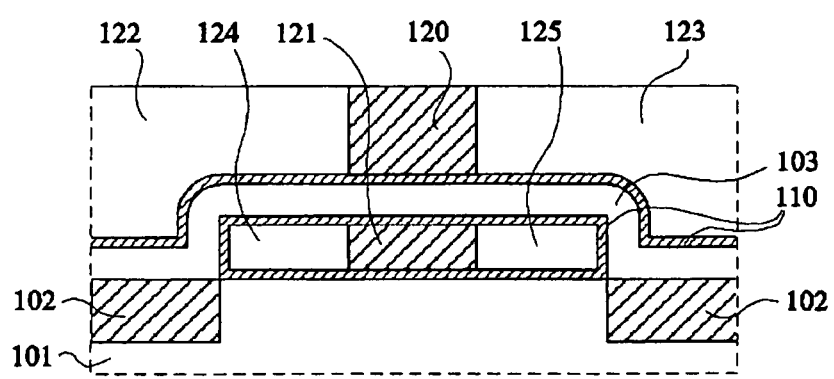

At the next step, illustrated in FIG. 3B, photosensitive layer 111 is insolated by using an electron beam capable of crossing the photosensitive layer located above bridge 103, bridge 103 being covered with a thin silicon oxide layer and the photosensitive layer placed under bridge 103. In the case where the photosensitive layer is positive, a portion 120 of photosensitive layer 111 located above the central portion of bridge 103 and a portion 121 of photosensitive layer 111 located above portion 120 under bridge 103 are insolated. Portions, not shown, of the photosensitive layer located in prolongation of portions 120 and 121 on each side of bridge 103 are further insolated. In the case where the photosensitive layer is negative, portions 122 and 123 of the photosensitive layer respectively located above the left-hand and right-hand portions of bridge 103 as well as portions 124 and 125 respectively located under the left-hand and right-hand portions of bridge 103 are insolated. Portions of the photosensitive layer, not shown, located in prolongation of portions 122 to 125 on each side of bridge 123, are also insolated.

Figure 3C:
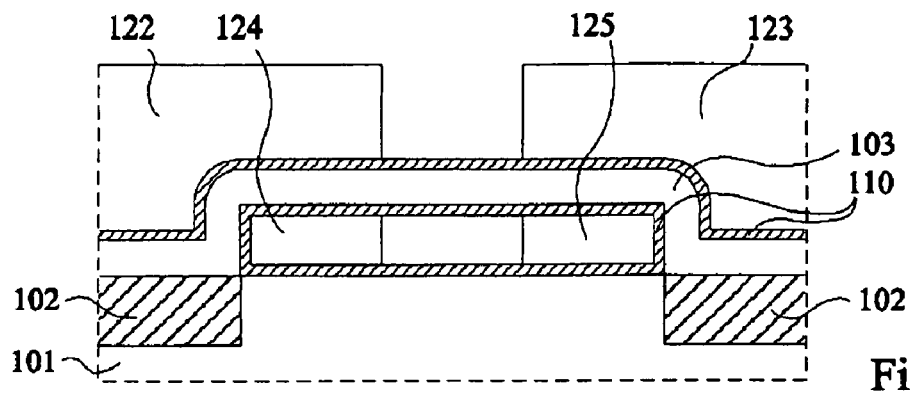

At the next step, illustrated in FIG. 3C, portions 120 and 121 as well as portions located in prolongation of portions 120 and 121 on each side of bridge 103 are removed.

Figure 3D:
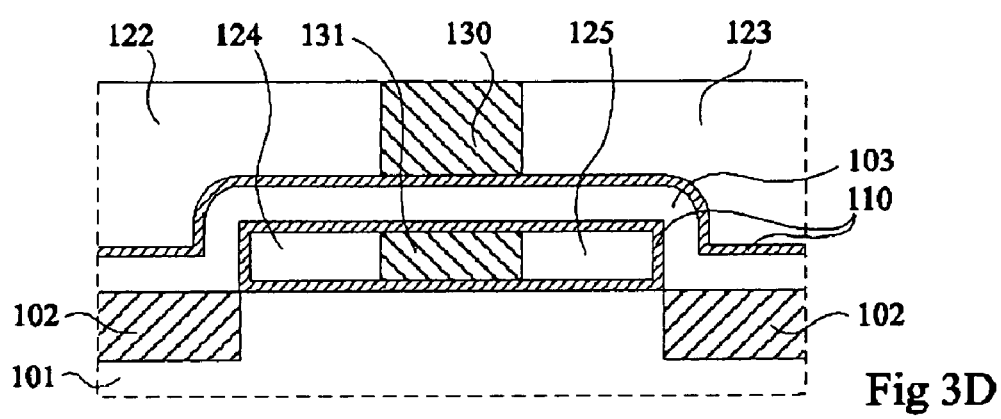

At the next step, illustrated in FIG. 3D, a conductive material, for example, polysilicon, is deposited in the space previously taken up by portions 120 and 121 and by the portions placed in prolongation of portions 120 and 121 on each side of bridge 103. Gate portions 130 and 131 respectively above and under bridge 103 and gate portions, not shown, on each side of bridge 103 in prolongation of portions 130 and 131, are then obtained. These portions altogether form one and the same gate surrounding bridge 103.

Figure 3E:
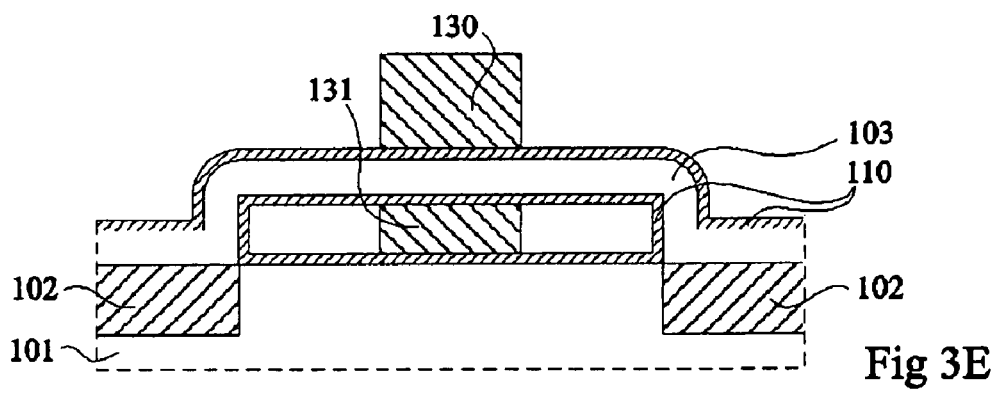

At the next step, illustrated in FIG. 3E, the remaining portions of the photosensitive layer, that is, portions 122 to 125, as well as the portions placed in prolongation of portions 122 to 125 on each side of bridge 103, are removed.

Figure 3F:
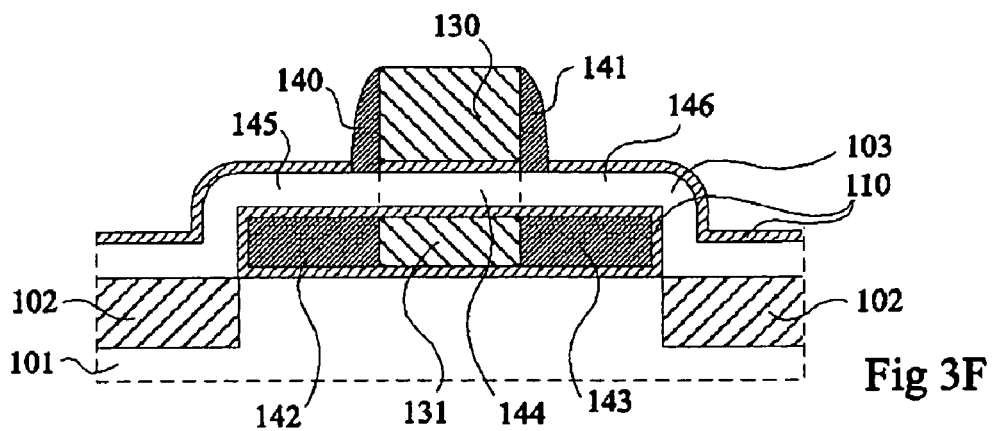

At the next step, illustrated in FIG. 3F, a nitride deposition is performed to entirely cover the previously-obtained structure and to fill the empty spaces located under bridge 103 on either side of portion 131. An anisotropic etching of the nitride is then performed to expose the upper surface of gate portion 130, of the thin oxide layer 110 placed on bridge 103, and of active area 100 on either side of bridge 103. After this nitride etching, spacers 140 and 141 have been formed on the sides of portion 130 and nitride portions 142 and 143 under bridge 103 on either side of gate portion 131. The portion of bridge 103 located under polysilicon portions 130 and 131 forms the transistor channel. The portions of bridge 103 located on either side of channel 144 form source/drain areas 145 and 146.

An advantage of the previously-described method is that it enables forming a gate-all-around transistor such that the gate portions placed above and under the silicon bridge are aligned.

Another embodiment of the method of the present invention is described hereafter in an example of realization of an integrated circuit interconnect network.

Figure 4A:
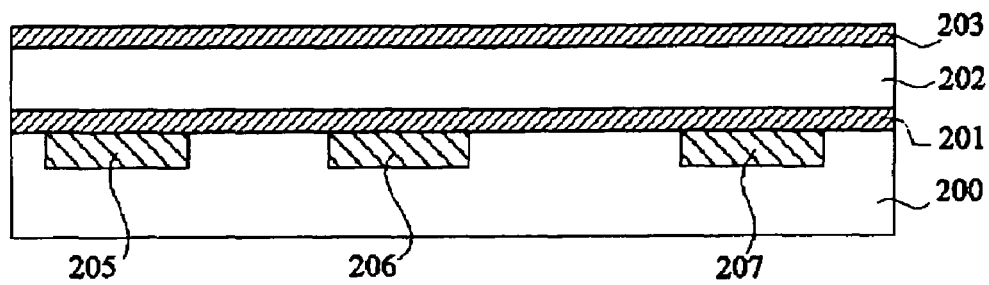
FIGS. 4A to 4F are cross-section views of structures obtained after successive steps of another example of implementation of the method of the present invention.

In an initial step, illustrated in FIG. 4A, a stacking of an insulating layer 201, of a photosensitive layer 202, and of an insulating layer 203, are formed on a substrate 200. Substrate 200 may have any structure obtained after a step of a standard integrated circuit forming method. As an example, three conductive areas 205, 206, and 207 are shown at the surface of substrate 200. Conductive areas 205, 206, and 207 are for example terminals of access to components of the integrated circuit formed in substrate 200. Insulating layers 201 and 203 may be thin silicon oxide layers or layers of an insulator preferably exhibiting a small dielectric constant.

Figure 4B:
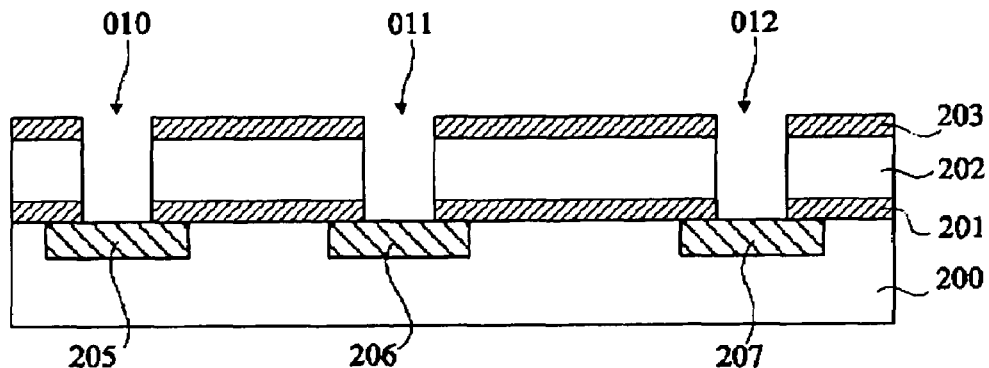

At the next step, illustrated in FIG. 4B, openings O10, O11, and O12 are formed in the stacking of layers 201 to 203 above conductive areas 205, 206, and 207. Openings O10, O11, and O12 may be formed according to a method comprising the following steps. A nitride layer followed by a photosensitive layer is deposited on insulating layer 203. Portions of the photosensitive layer above conductive areas 205, 206, and 207 are insolated and removed. The unprotected portions of the nitride layer are etched. Insulating layer 203, photosensitive layer 202, and insulating layer 201 are successively etched according to an anisotropic etch method enabling formation of openings having substantially vertical walls. The remaining portions of the nitride layer are finally removed.

Figure 4C:
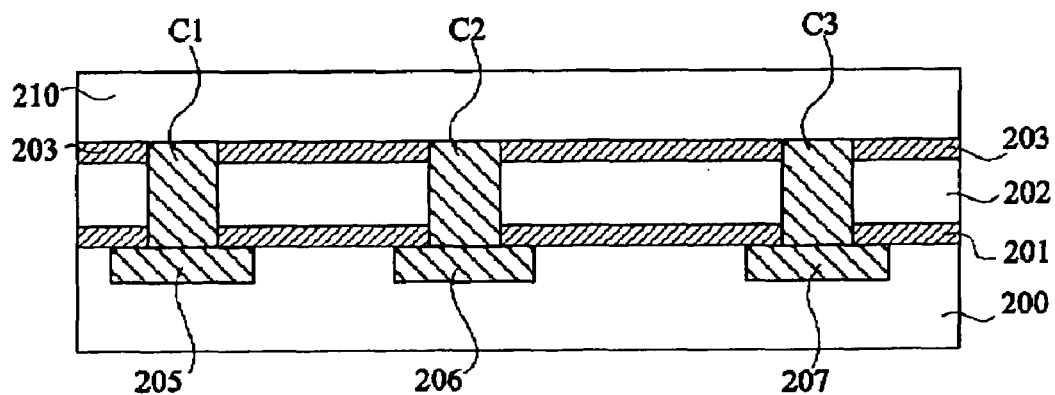

At the next step, illustrated in FIG. 4C, openings O10, O11, and O12 are filled with a conductive material such as copper to form contacts C1, C2, and C3 above conductive areas 205, 206, and 207. The filling of openings O10, O11, and O12 may consist of performing a copper deposition over the entire structure, then performing a chem.-mech polishing to expose insulating layer 203. Insulating layer 203 and contacts C1, C2, and C3 are then covered with a photosensitive layer 210.

Figure 4D:
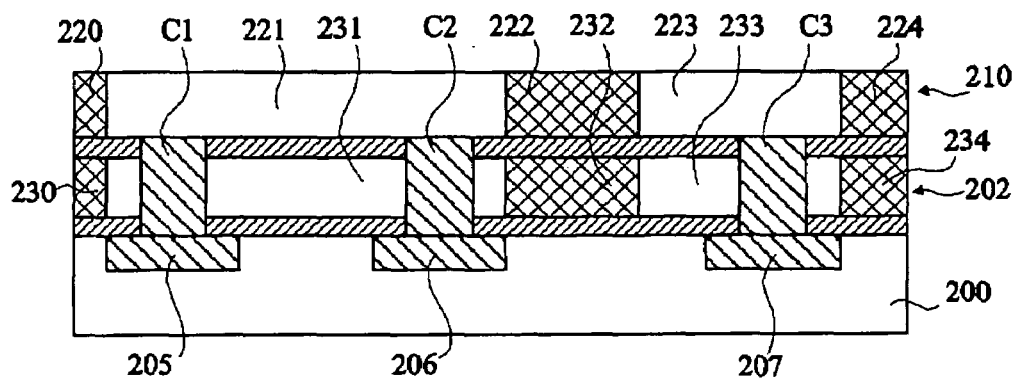

At the next step, illustrated in FIG. 4D, the two layers of photosensitive layer 202 and 210 are insolated with an electron beam passing through photosensitive layer 210, insulating layer 203, and photosensitive layer 202. In this example, five portions 220, 221, 222, 223, and 224 are defined from left to right of photosensitive layer 210 and five portions 230, 231, 232, 233, and 234 respectively above portions 220 to 224 are also defined in photosensitive layer 202. Portion 221 extends above contacts C1 and C2, portion 223 is placed above contact C3. In the case where the photosensitive layer is positive, portions 221, 223, 231, and 233 are insolated. In the case where the photosensitive layer is negative, portions 220, 222, 224, 230, 232, and 234 are insolated.

Figure 4E:
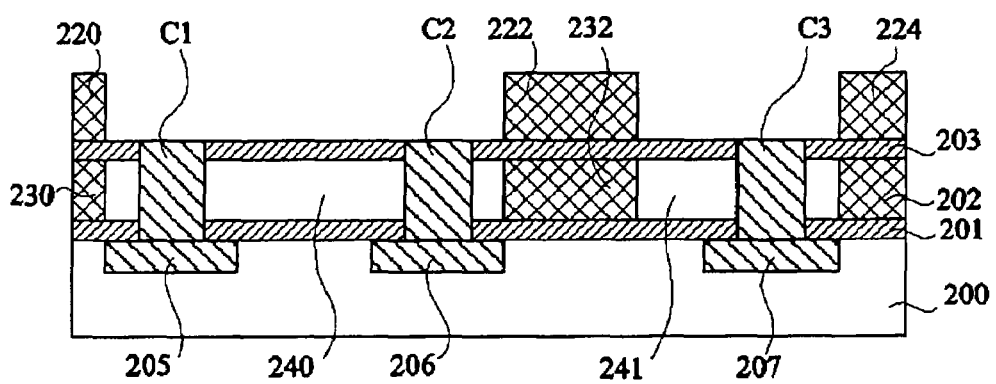

At the next step, illustrated in FIG. 4E, portions 221 and 223 of photosensitive layer 210 are removed according to a conventional development method. Portions 231 and 233 are then removed by placing the structure in a plasma so that the photosensitive layer volatilizes after transformation in passing through insulating layer 203. The removed portions of the photosensitive layer are then replaced with empty areas 240 and 241. Another way to remove portions 231 and 233 comprising forming small openings in insulating layer 203 above these portions, then of removing them by wet etch.

Figure 4F:
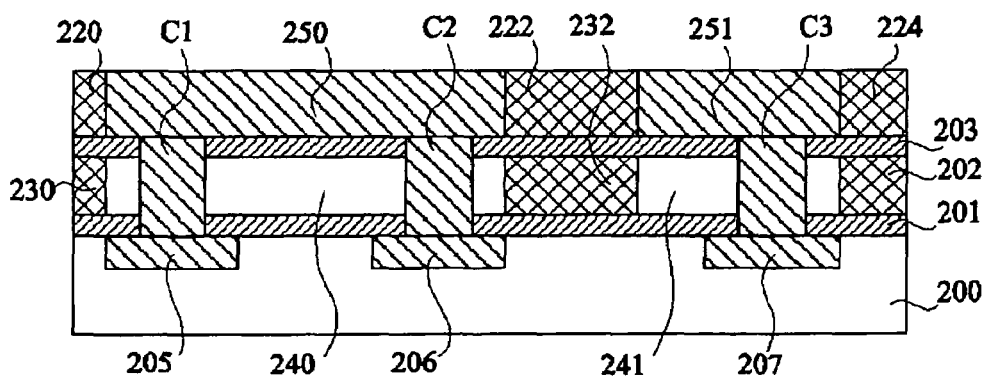

At the next step, illustrated in FIG. 4F, the space previously taken up by portions 221 and 223 of the photosensitive layer is filled with a conductive material such as copper to form conductive lines 250 and 251. The forming of the conductive layers may be performed by depositing copper over the entire structure and by performing a chem.-mech polishing to expose the upper surface of portions 220, 222, and 224 of the photosensitive layer. Conductive areas 205 and 206 are then connected via contacts C1 and C2 and conductive line 250.

The previously-described step sequence comprising forming contacts, then conductive lines, may be repeated several times to form several conductive line levels.

An advantage of the specific embodiment of the present invention is that it enables forming an interconnect network such that each conductive line is insulated from the other conductive lines by two very thin portions of an insulating layer and by an empty area forming the best possible insulator.

Further, the insulation between two lines placed on two successive levels being very good, it is possible to decrease the height of the contacts, which enables significantly reducing their resistance.

Of course, the present invention is likely to have various alterations, modifications, and improvements which will readily occur to those skilled in the art. In particular, it may be provided to form on a substrate a stacking of several photosensitive layers and of layers of one or several given materials before performing an insolation of all the photosensitive layers by means of an electron beam crossing the layer assembly. Further, various methods may be implemented to form a stacking of photosensitive layers and of layers of one or several materials.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming an interconnect network comprising:
    covering a substrate with a stacking of a first insulating layer, of a first photosensitive layer, and of a second insulating layer;
    forming openings in the stacking;
    filling the openings in the stacking with a conductive material to form contacts;
    covering the second insulating layer and the contacts with a second photosensitive layer;
    insolating, with an electron beam crossing the second insulating layer, several pairs of portions of the photosensitive layers or their complements according to whether the photosensitive layers are positive or negative, each pair comprising a first portion of the first photosensitive layer and a second portion of the second photosensitive layer, first and second portions of each pair being superposed;
    removing said pairs of portions of the photosensitive layers; and
    filling with a conductive material the space previously taken up by the second portions of each of the pairs located above the second insulating layer.

2. The method of claim 1, wherein the removal of said first portions of each of the pairs is performed by means of a plasma, said first portions volatilizing after transformation in crossing said second insulating layer.

* * * * *